United States Patent
Hong

(10) Patent No.: US 9,117,887 B2
(45) Date of Patent: Aug. 25, 2015

(54) FABRICATION METHOD OF SEMICONDUCTOR DEVICE

(71) Applicant: Semiconductor Manufacturing International (Shanghai) Corporation, Shanghai (CN)

(72) Inventor: Zhongshan Hong, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/183,553

(22) Filed: Feb. 19, 2014

(65) Prior Publication Data
US 2015/0108652 A1    Apr. 23, 2015

(30) Foreign Application Priority Data
Oct. 23, 2013    (CN) .......................... 2013 1 0505108

(51) Int. Cl.
| H01L 21/44 | (2006.01) |
| H01L 21/4763 | (2006.01) |
| H01L 21/768 | (2006.01) |
| H01L 23/522 | (2006.01) |
| H01L 23/532 | (2006.01) |

(52) U.S. Cl.
CPC ...... *H01L 21/76879* (2013.01); *H01L 23/5221* (2013.01); *H01L 23/5226* (2013.01); *H01L 23/5329* (2013.01); *H01L 23/53238* (2013.01); *H01L 23/53295* (2013.01)

(58) Field of Classification Search
CPC .................. H01L 21/76843; H01L 21/76838; H01L 21/76877; H01L 21/76834; H01L 2924/01079; H01L 2924/14; H01L 2924/01078; H01L 23/481; H01L 21/76879; H01L 23/53295; H01L 23/53238; H01L 23/5329; H01L 23/5221; H01L 23/5226
USPC ......... 438/618, 666, 622, 624, 629, 637, 667, 438/672, 675
See application file for complete search history.

(56) References Cited

U.S. PATENT DOCUMENTS

| 2014/0029181 A1* | 1/2014 | Gstrein et al. ........... 361/679.02 |
| 2014/0084481 A1* | 3/2014 | Zhang et al. .................. 257/774 |
| 2014/0203827 A1* | 7/2014 | Thangaraju et al. .......... 324/713 |

* cited by examiner

*Primary Examiner* — A. Sefer
*Assistant Examiner* — Dilinh Nguyen
(74) *Attorney, Agent, or Firm* — Anova Law Group, PLLC

(57) ABSTRACT

A semiconductor device and its fabrication method are provided. A first dielectric layer is provided to cover a substrate. The first dielectric layer contains a plurality of first conductive layers. A portion of each first conductive layer is removed to form a plurality of first openings in the first dielectric layer. A second dielectric layer is formed in each first opening. A third dielectric layer having second-openings are formed on the first dielectric layer and on the second dielectric layers. Each second-opening exposes at least two adjacent second dielectric layers. Second dielectric layers exposed by a first second-opening are removed to form third openings to expose corresponding first conductive layers. Second conductive layers are formed in the third opening and the second-openings including the first second-opening. Stable electrical interconnections with high quality electrical isolations can be provided.

16 Claims, 5 Drawing Sheets

US 9,117,887 B2

FABRICATION METHOD OF SEMICONDUCTOR DEVICE

CROSS-REFERENCES TO RELATED APPLICATIONS

This application claims the priority to Chinese Patent Application No. CN201310505108.1, filed on Oct. 23, 2013, which is incorporated herein by reference in its entirety.

FIELD OF THE DISCLOSURE

The present disclosure generally relates to the field of semiconductor manufacturing technology and, more particularly, relates to semiconductor devices and their fabrication methods.

BACKGROUND

Currently, various metal interconnections (e.g., copper interconnection structure) and their fabrication processes (e.g., electro-coppering plating (ECP)) have been developed in the semiconductor manufacturing field to electrically interconnect semiconductor devices. However, with advances of integrated circuits with ultra-large scale integration (ULSI), critical dimensions (CD) of semiconductor devices are continuously reduced and fabrication processes of metal interconnection structures are challenged.

FIGS. 1-3 show cross sectional views of a conventional copper interconnection structure at various formation stages. As shown in FIGS. 1-3, the fabrication method includes: providing a substrate 100 having a first dielectric layer 101, the first dielectric layer 101 containing an electrically conductive layer 102 and exposing a surface of the electrically conductive layer 102; forming a second dielectric layer 103 to cover both the first dielectric layer 101 and the electrically conductive layer 102; forming an opening 104 in the second dielectric layer 103 to expose the electrically conductive layer 102 (as shown in FIG. 2); forming a seed layer (not illustrated) on the sidewalls and bottom surface of the opening 104, the seed layer being made of an electrically conductive material; and filling the opening 104 completely by an ECP process to form a copper interconnection layer 105.

However, such copper interconnection structures formed by conventional techniques provide undesired performance and it is desirable to provide stable electrical interconnections with high quality electrical isolations.

BRIEF SUMMARY OF THE DISCLOSURE

One aspect of the present disclosure includes a method for fabricating a semiconductor structure. A first dielectric layer is provided on a substrate. The first dielectric layer includes a plurality of first conductive layers formed through the first dielectric layer. The plurality of first conductive layers has a top surface leveled with a top surface of the first dielectric layer. A portion of each first conductive layer of the plurality of first conductive layers is removed to form a first opening in the first dielectric layer and on each first conductive layer. A second dielectric layer in the first opening is formed having a top surface leveled with the top surface of the first dielectric layer. A third dielectric layer is formed at least on the first dielectric layer. The third dielectric layer contains a plurality of second-openings. Each second-opening exposes at least two adjacent second dielectric layers at a bottom of the second-opening. At least two adjacent second dielectric layers exposed at the bottom of a first second-opening are removed to form third openings that expose top surfaces of at least two adjacent first conductive layers corresponding to the first second-opening. A second second-opening in the third dielectric layer exposes at least two adjacent second dielectric layers at a bottom of the second second-opening. Second conductive layers are formed in the third opening, the first second-opening, and the second second-opening.

Another aspect of the present disclosure includes a semiconductor device. The semiconductor device includes a substrate, a first dielectric layer, a first conductive layer, a second dielectric layer, a third dielectric layer, and a second conductive layer. The first dielectric layer is disposed on the substrate and contains a plurality of the first conductive layers through the first dielectric layer. The plurality of the first conductive layers has a top surface lower than a top surface of the first dielectric layer. The second dielectric layer is disposed on each first conductive layer of a first group of the first conductive layers selected from the plurality of the first conductive layers. The second dielectric layer has a top surface leveled with the top surface of the first dielectric layer. The third dielectric layer is disposed on the first dielectric layer and also on surface portions of the substrate between adjacent second dielectric layers of the plurality of second dielectric layers. The second conductive layer is disposed on each first conductive layer of a second group of the first conductive layers selected from the plurality of the first conductive layers and is also disposed on the second dielectric layer on the each first conductive layer of the first group of the first conductive layers.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
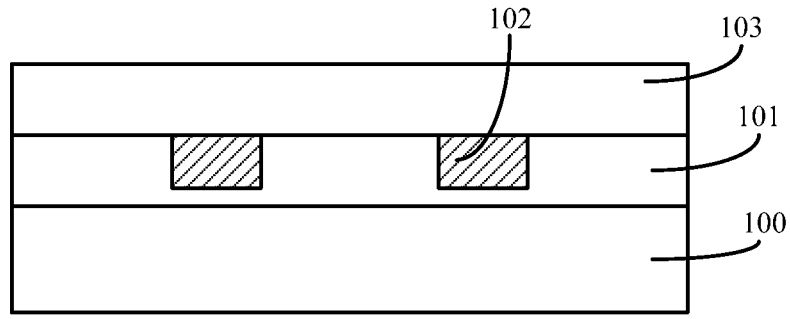
FIGS. 1-3 depict cross sectional views of a copper interconnection structure at various formation stages in accordance with a conventional method.
Figure 2:
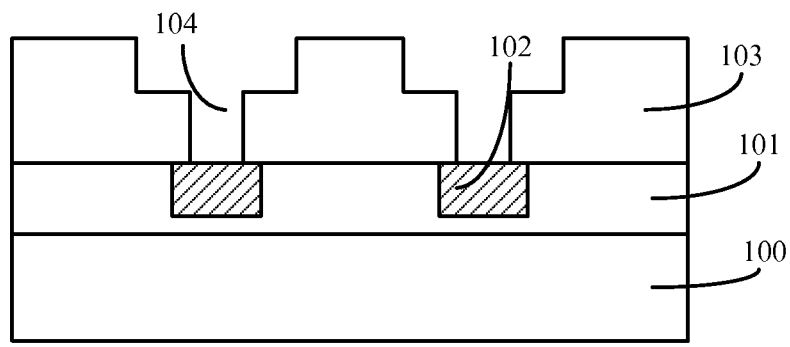
Figure 3:
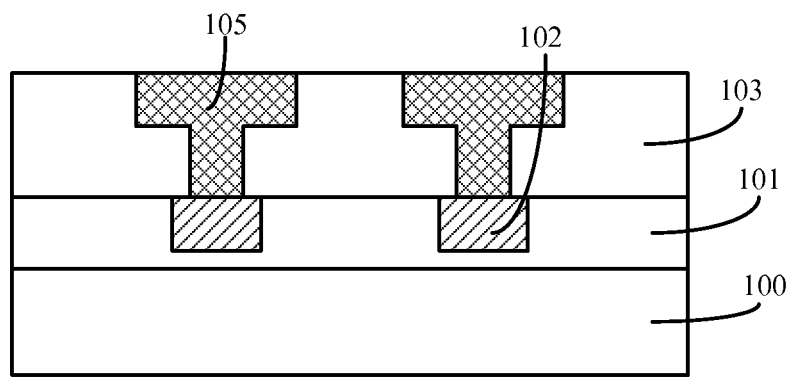

With enhanced degree of integration of integrated circuits (ICs) and reduced size of semiconductor devices, as shown in FIG. 1, the K value (i.e., dielectric constant) of either the first dielectric layer 101 or the second dielectric layer 103 is required to be decreased to improve device performance and device reliability by improving electrical isolation of either the first dielectric layer 101 or the second dielectric layer 103. The first dielectric layer 101 and the second dielectric layer 103 may thus be formed with a low-k material to provide electrical isolation. In some cases, air gaps may be formed in the first dielectric layer 101 or in the second dielectric layer 103 to reduce the K value.

Figure 4:
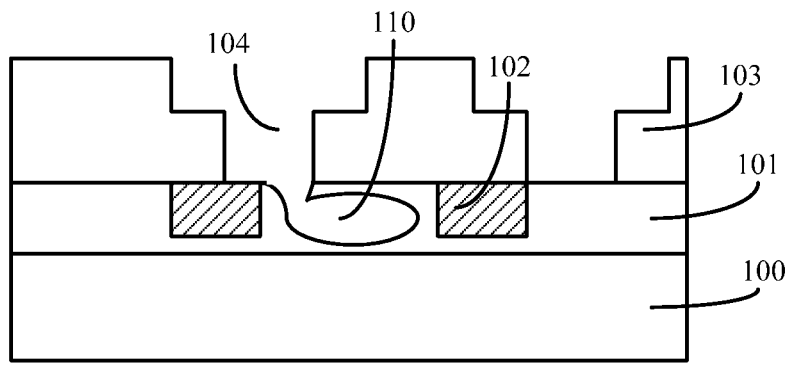
FIG. 4 is a schematic illustrating an isolation structure.

FIG. 4 is a schematic illustrating a first dielectric layer containing an air gap used for electrically isolating the conductive layer. As shown in FIG. 4, an air gap 110 is formed in the first dielectric layer 101 that electrically isolates the conductive layer 102. The opening 104 and the electrically conductive layer 102 may not align with one another during the formation of opening 104 due to alignment errors in a photolithography process. When the opening 104 and the electrically conductive layer 102 are misaligned, the opening 104 can readily open up the air gap 110 (i.e., the opening 104 can be connected with the air gap 110). As a result, a conductive material used for forming a copper interconnection structure can enter into the air gap through the bottom of the opening 104 during the subsequent formation of the copper interconnection structure in the opening 104. This, however, may cause many issues including, e.g., short-circuit neighboring conductive layers 102. Such issues can adversely affect the performance of the formed copper interconnection structure.

As disclosed herein, a semiconductor device and a method for fabricating the semiconductor structure are provided. The fabrication method can include, e.g., providing a first dielectric layer on a substrate. The first dielectric layer can contain a certain number of first conductive layers through the first dielectric layer. The first conductive layer can have a top surface leveled with a top surface of the first dielectric layer. A portion of the first conductive layers can be removed to have a top surface lower than the top surface of the first dielectric layer to form a certain number of first openings in the first dielectric layer. A second dielectric layer can then be formed in the first openings. The second dielectric layer can have a top surface leveled with the top surface of the first dielectric layer.

A third dielectric layer can be formed to cover the first dielectric layer and/or the second dielectric layer. The third dielectric layer can contain second openings each exposing at least two of the second dielectric layers. The second dielectric layers at the bottom of a first second-opening can be removed to form a third opening on a corresponding first conductive layer, i.e., the third opening exposing a top surface of at least two of the first conductive layers corresponding to the first second-opening. A second conductive layer can then be formed in both the third openings and other second-opening.

In an exemplary semiconductor structure, the first conductive layer has a top surface lower than a top surface of the first dielectric layer, and the second dielectric layer is formed on some of the first conductive layers. The third dielectric layer can cover the first dielectric layer (and/or the second dielectric layer) and can contain the second opening to expose at least two of the second dielectric layers. The second opening can define structure and position of the second conductive layer. A portion of the second dielectric layer at the bottom of one or more second openings can be removed to form the third opening to expose a surface of a corresponding first conductive layer and can only expose the corresponding first conductive layer. The subsequently formed second conductive layer can be in some of the second openings and the third openings. The second conductive layer can be electrically connected to the first conductive layer. Because the third opening exposes only the surface of the first conductive layers, position misalignment between the second conductive layer and the first conductive layer can be avoided. This can enhance stability of electrical connection between the second conductive layer and the first conductive layer. In addition, electrical isolation between neighboring first conductive layers can be improved.

Figure 12:
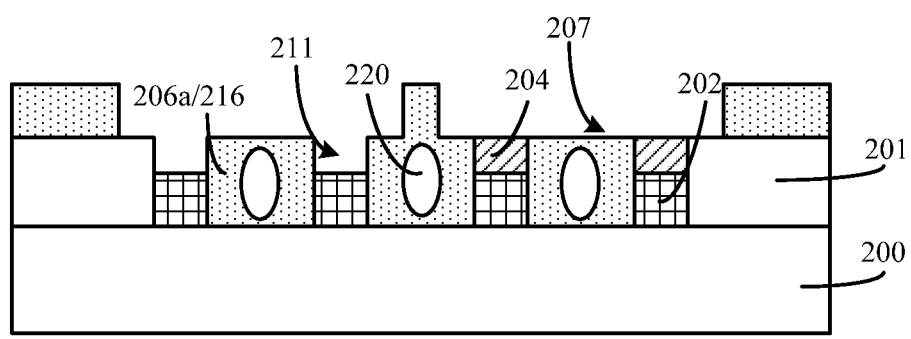
Figure 13:
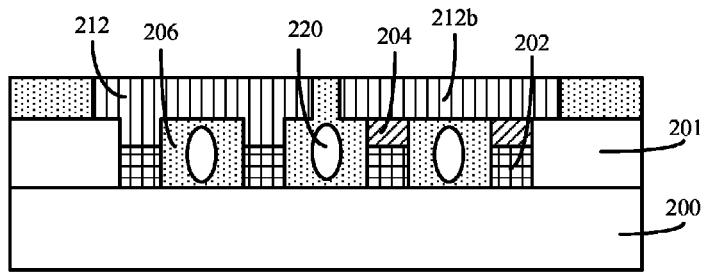
Figure 14:
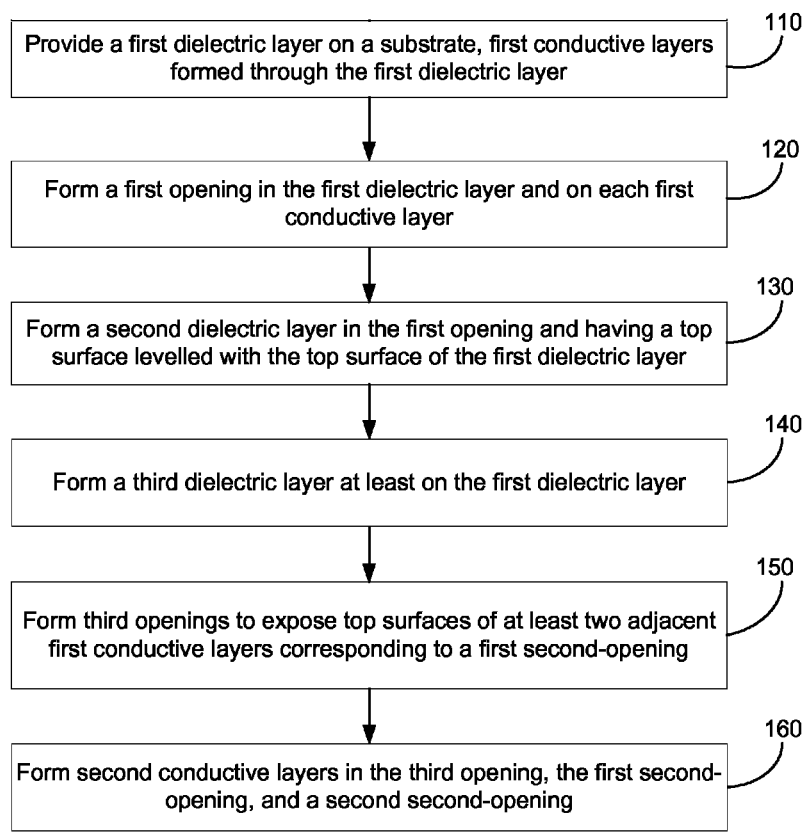
FIG. 14 depicts an exemplary method for forming a semiconductor device in accordance with various disclosed embodiments.

FIGS. 5-13 are schematics for an exemplary semiconductor device at various stages during formation, while FIG. 14 depicts an exemplary method for forming the semiconductor device.

Figure 5:
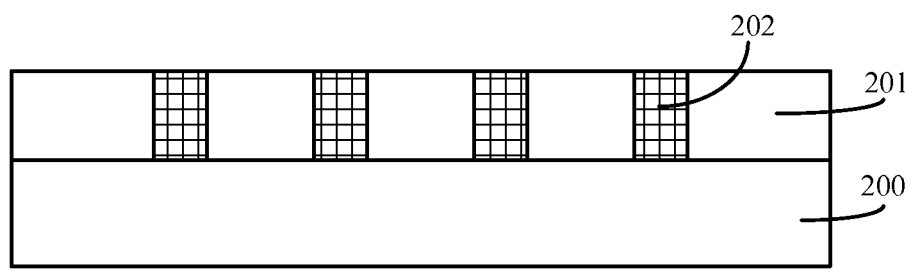
FIGS. 5-13 are schematics for an exemplary semiconductor device at various stages during formation in accordance with various disclosed embodiments.

In FIG. 5, a substrate 200 is provided. A first dielectric layer 201 containing a certain number of first conductive layers 202 through the first dielectric layer 201 is provided on the substrate 200. The first conductive layer 201 has a top surface levelled with a top surface of the first dielectric layer 201 (e.g., Step 110 of FIG. 14).

In one embodiment, the substrate 200 can include a semiconductor base; semiconductor devices formed in the semiconductor base or on surface of the semiconductor base; an interconnection structure for electrically connecting the semiconductor devices; and an insulation layer formed on the surface of the semiconductor base for electrically isolating the semiconductor devices from the conductive structure. The semiconductor base can be made of silicon, silicon germanium, silicon carbide, silicon-on-insulator, germanium-on-insulator, glass, or group III-V compounds (e.g., germanium nitride, germanium arsenide, etc.). The insulation layer covers the substrate 200. In other embodiments, the substrate can be a semiconductor base containing an electrical interconnection structure, e.g., a through-silicon-via (TSV).

The first dielectric layer 201 can protect and electrically isolate the first conductive layers 202. The first dielectric layer 201 can be made of $SiO_2$, SiN, SiON, SiCOH, and/or low-k materials (e.g., a porous dielectric material). When the first dielectric layer is made of low-k materials, the first dielectric layer 201 has a more desirable performance. For example, parasitic capacitance and leakage current can be reduced. Additionally, air gaps can be formed in the first dielectric layer 201 between neighboring first conductive layers 202 to further enhance electrical isolation of the first dielectric layer 201 between the first conductive layers 202.

The first conductive layer 202 can be connected to electrical interconnection structure (not illustrated) formed in the substrate 200. The number of the first conductive layers can be two or more. In an exemplary embodiment, the first conductive layers 202 can be made of copper. In a direction parallel to the surface of the substrate 200, the first conductive layers 202 can be configured as a number of stripes. These stripes are also configured in parallel. In other embodiments, the first conductive layers can be made of any suitable conductive materials, e.g., tungsten and/or aluminum.

In one embodiment, the first dielectric layer 201 and the first conductive layers 202 can be formed by, e.g., depositing the first dielectric layer on the surface of the substrate 200, etching away a portion of the first dielectric layer to form a certain number of trenches in the first dielectric layer, and completely filling the trenches with conductive materials by an electroplating process to form the first conductive layers.

In another embodiment, the first dielectric layer 201 and the first conductive layers 202 can be formed by, e.g., forming a first conductive thin film by an electroplating process on the surface of the substrate 200, etching the first conductive thin film to form a certain number of the first conductive layers 202 on the surface of the substrate 200, and forming the first dielectric layer 201 to cover both the substrate 200 and the first conductive layers 202. The surface of the first dielectric layer 201 can be leveled with the top surface of the first conductive layers 202.

In other embodiments, a plasma enhanced chemical vapor deposition process (PECVD) can be employed to form the first dielectric layer that can contain an air gap between neighboring first conductive layers 202. The air gap can improve electrical isolation capability of the first dielectric layer 201. When the first dielectric layer contains air gaps, after the subsequent formation of the second dielectric layer, a third dielectric layer can be formed on the surfaces of the first dielectric layer and the second dielectric layer such that there is no need to remove the first dielectric layer between neighboring first conductive layers to form a fourth opening.

Figure 6:
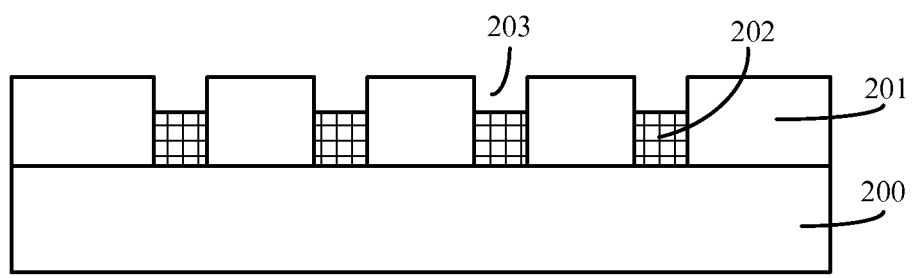

In FIG. 6, a portion of the first conductive layers 202 can be removed to provide a top surface of the first conductive layers 202 lower than the top surface of the first dielectric layer 201. A certain number of first openings 203 can then be created in the first dielectric layer 201 (e.g., Step 120 of FIG. 14).

First openings 203 can be formed on the top surface of the first conductive layers 202 after portions of the first conductive layers 202 are removed as shown in FIG. 6. The first openings 203 can be subsequently used to form a second dielectric layer that has an etching selectivity over the first dielectric layer. As such, the first conductive layers 202 can be exposed by removing only a portion of the second dielectric layer in the subsequent processes. The exposed first conductive layers 202 can connect with subsequently formed second conductive layers while the first dielectric layer cannot be damaged in the processes. This can ensure accuracy of the relative position between the second conducive layers and the first conductive layers 202.

An etching process can be used to remove portions of the first conductive layers 202 to form the first openings 203. The etching process can be an anisotropic dry etching process, an isotropic dry etching process, or an anisotropic wet etching process. Etching depth can be controlled by controlling etching time due to the constant etching rate of the etching process. Thus the depth of the first openings 203 can be controlled precisely, and accordingly, the thickness of the second dielectric layers formed subsequently in the first openings 203 can be controlled precisely as well.

Figure 7:
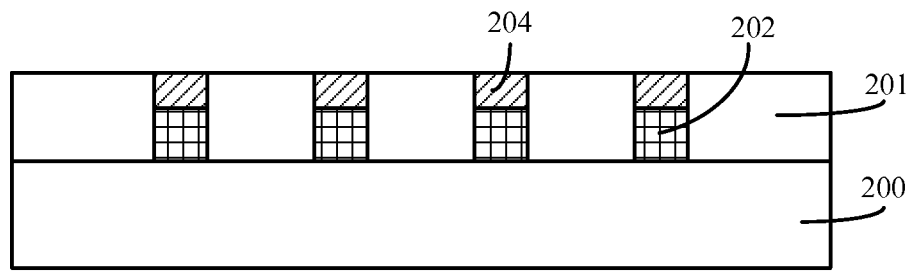

In FIG. 7, a second dielectric layer 204 can be formed in each of the first openings 203. The second dielectric layers 204 can have a top surface leveled with the top surface of the first dielectric layer 201 (e.g., Step 130 of FIG. 14).

In one embodiment, barrier layers (not illustrated) can be formed on the surfaces of the first conductive layers 202 at the bottoms of the first openings 203 prior to forming the second dielectric layers 204. The second dielectric layers 204 can then be formed on surfaces of the barrier layers. The barrier layers can prevent materials diffusion of the first conductive layers 202 to ensure a desired electrical performance of the first conductive layers 202. The barrier layers can be formed by a selective deposition process, and can be made of conductive materials including, e.g., CoWP, CuAl, CuMn and/or Co.

The selective deposition process can deposit the barrier layers selectively on surface of the conductive materials. That is, the barrier layer can be formed on the surfaces of the first conductive layers 202 at the bottoms of the first openings 203 rather than on surface of the first dielectric layer 201. The selective deposition process can be a simple process for forming the barrier layers, and can form barrier layers having a uniform thickness.

In one embodiment, the barrier layers can be made of CoWP, and the selective deposition process for forming the barrier layers can be a selective electroless plating process. The selective electroless plating process can include deposition liquid including oxidizing agent, reducing agent, and basic solution. The basic solution can have a PH of about 8.9 to about 9 at a temperature of about 20° C. to about 90° C. In an exemplary embodiment, when the barrier layers are made of CoWP, the oxidizing agent can include $H_3P(W_3O_{10})_4$ and $CoSO_4.6H_2O$; the reducing agent can include $NaH_2PO_2$ having a concentration ranging from about 0.23 mole/l to 0.25 mole/l; and the basic solution can be KOH solution. In another embodiment, when the barrier layers are made of CuAl, CuSi, CuAlSi, and/or CuMn, the process for forming the barrier layers can be a selective CVD (i.e., chemical vapor deposition) process.

The second dielectric layers 204 can be made of NDC (negative dielectric constant) material, SiN, SiCOH, BN, SiCN, and/or low-k materials. The process for forming the second dielectric layers 204 can include forming a second dielectric thin film in the first openings 203 and on the surface of the first dielectric layer 201, and polishing the second dielectric thin film to expose the surface of the first dielectric layer 201 to form the second dielectric layers 204.

Since the second dielectric layers 204 have an etching selectivity over the first dielectric layer 201, the first dielectric layer 201 cannot be etched or damaged when portions of the second dielectric layers 204 are subsequently removed and third openings are formed on top of the first conductive layers 202. As such, the third openings can only be formed on the top of a group of the first conductive layers 202, and positions of the second conductive layers formed in the third openings are precise relative to the positions of the first conductive layers 202 (e.g., as shown in FIGS. 12-13). In an exemplary embodiment, the first dielectric layer 201 and the second dielectric layers 204 can be made of different materials.

In addition, since the second dielectric layers 204 have an etching selectivity over the first dielectric layer 201, an area exposed by a photoresist layer as a mask layer can be larger than an area for forming the third openings when the third openings are subsequently formed. The photoresist layer can simultaneously expose at least two adjacent second dielectric layers 204 and corresponding first conductive layers 202. The morphology of the first dielectric layer 201 is not affected when etching the second dielectric layers 204 using the photoresist layer as a mask. Accuracy of a photolithography process for forming the photoresist layer does not affect accuracy of position and dimension of the formed third openings.

Figure 8:
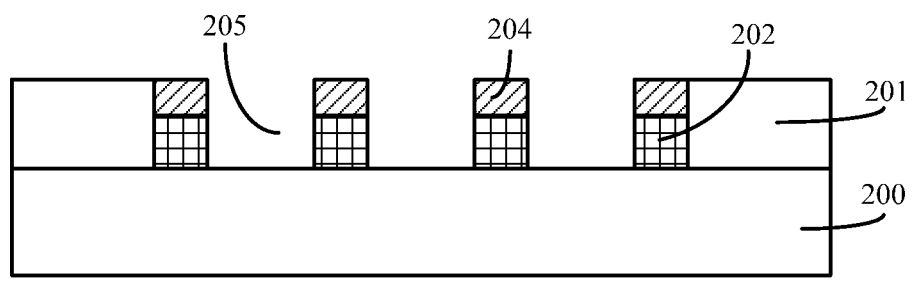

In FIG. 8, after formation of the second dielectric layers 204, portions of the first dielectric layer 201 between neighboring first conductive layers 202 are removed to expose surface portions of the substrate 200 to form fourth openings 205 between neighboring first conductive layers 202.

Figure 9:
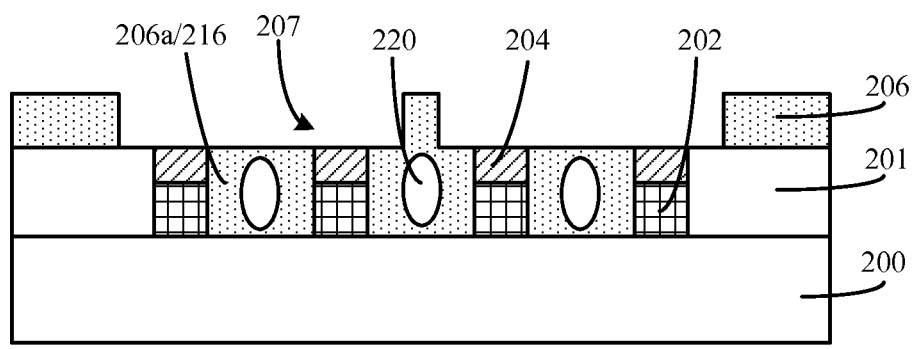

In an exemplary embodiment, the fourth openings 205 can be used to fill third dielectric layers 206a (e.g., shown in FIG. 9). The third dielectric layers 206a can contain air gaps 220 to improve electrical isolation capability between neighboring first conductive layers 202.

In another embodiment, the fourth openings 205 can be filled with fourth dielectric layers 216 (e.g., shown in FIG. 9), while then the third dielectric layer 206 can be formed on the surfaces of the remaining portion of the first dielectric layer 201, the second dielectric layers 204, and the formed fourth dielectric layers 216 in the fourth openings 205. The fourth dielectric layers 216 can contain air gaps to improve electrical isolation capability.

The formation process for the fourth openings 205 can include forming a patterned layer on the surface of the first dielectric layer 201, the patterned layer exposing the portions of the first dielectric layer 201 between the second dielectric layers 204 (and the neighboring first conductive layers 202); and etching the first dielectric layer 201 using the patterned layer as a mask to expose the surface portions of the substrate 200.

Processes for etching the portions of the first dielectric layer 201 can be a dry etching process or a wet etching process. In an exemplary embodiment, the etching process for etching the first dielectric layer 201 can be an isotropic wet etching process. The isotropic wet etching process has a high etching rate and causes little or no damages to the first conductive layers 202 and the second dielectric layers 204.

In other embodiments, the portions of the first dielectric layer between neighboring first conductive layers 202 can contain air gaps, then there is no need to remove the portions of the first dielectric layer between neighboring first conductive layers 202, and the subsequently-formed third dielectric layer can be on the surfaces of the first dielectric layer and the second dielectric layers.

In FIG. 9, a third dielectric layer 206 can be formed on the surfaces of both remaining portions of the first dielectric layer 201 and the second dielectric layer 204. The third dielectric layer 206 can contain second openings 207. Each second opening 207 can expose at least two dielectric layers 204 at a bottom of the second opening 207 (e.g., Step 140 of FIG. 14).

Second conductive layers 208 (e.g., shown in FIG. 10) can be formed in the second openings 207. Since at least two second dielectric layers 204 can be exposed at the bottom of one second opening 207, the first conductive layers 202 at the bottoms of the second openings 207 can be electrically connected to the second conductive layers 208 in the second openings 207.

In an exemplary embodiment, the fourth openings 205 (as shown in FIG. 8) can be formed between neighboring first conductive layers 202, and the third dielectric layers 206a can be formed in the fourth openings 205. The third dielectric layers 206a between neighboring first conductive layers 202 can contain air gaps 220. The air gaps 220 can enhance electrical isolation capability to prevent leakage current between neighboring first conductive layers 202, and can decrease parasitic capacitance between neighboring first conductive layers 202.

The third dielectric layers 206a/206 can be made of $SiO_2$, SiN, SiON, and/or low-k materials. The process for forming the third dielectric layers 206a/206 and the second openings 207 can include, e.g., forming the third dielectric layer material by a deposition process in the fourth openings 205 and on the surfaces of the first dielectric layer 201 and the second dielectric layers 204; planarizing the third dielectric layer material using a polishing process after the deposition process, the surfaces of the polished third dielectric layers being higher than the surfaces of the first dielectric layer 201 and the second dielectric layers 204; etching a portion of the third dielectric layer material after polishing until exposing at least two of the second dielectric layers 204; and forming the second openings 207 in the third dielectric layers 206. In an exemplary embodiment, the third dielectric layers 206a/206 can be used to fill the fourth openings 205, and the third dielectric layers 206a formed in the fourth openings 205 can contain air gaps 220. In this manner, manufacturing processes can be simplified, and time and cost for processing can be reduced.

The deposition process for forming the third dielectric layers 206a/206 can be a PECVD. The PECVD can deposit more materials (e.g., used to form the third dielectric layers) on the sidewalls close to the top of the fourth opening 205. As a result, the top of the fourth opening 205 can close first before the fourth opening 205 can be filled completely, and an air gap 220 can thus be formed in the third dielectric layer 206a in the fourth opening 205.

In another embodiment, a fourth dielectric layer 216 can be formed in the fourth opening 205, and the surface of the fourth dielectric layer 216 can be leveled with the second dielectric layer 204 and the first dielectric layer 201. The third dielectric layer 206 can be formed on the surface of the fourth dielectric layer 216. The fourth dielectric layer 216 can contain an air gap 220.

The fourth dielectric layer 216 can be made of $SiO_2$, SiN, SiON, SiCOH, and/or low-k materials. The process for forming the fourth dielectric layer 216 can include, e.g., forming a fourth dielectric thin film in the fourth opening 205 and on the surfaces of the first dielectric layer 201 and the second dielectric layer 204; polishing the fourth dielectric thin film until exposing the surface of the second dielectric layer 204; and forming the fourth dielectric layer 216. The formation process for forming the fourth dielectric thin film can be, e.g., a PECVD, which can close the fourth opening at the opening before completely filling the fourth opening such that air gaps can be formed in the fourth dielectric layer 216.

The formation process for forming the third dielectric layer 206 and the second opening 207 can include, e.g., forming the third dielectric layer by a deposition process on the surfaces of the fourth dielectric layer 216, the first dielectric layer 201, and the second dielectric layer 204; etching a portion of the third dielectric layer until exposing at least two of the second dielectric layers 204 and the first dielectric layer 201 between neighboring second dielectric layers 204; and forming the second opening 207 in the third dielectric layer 206.

Figure 10:
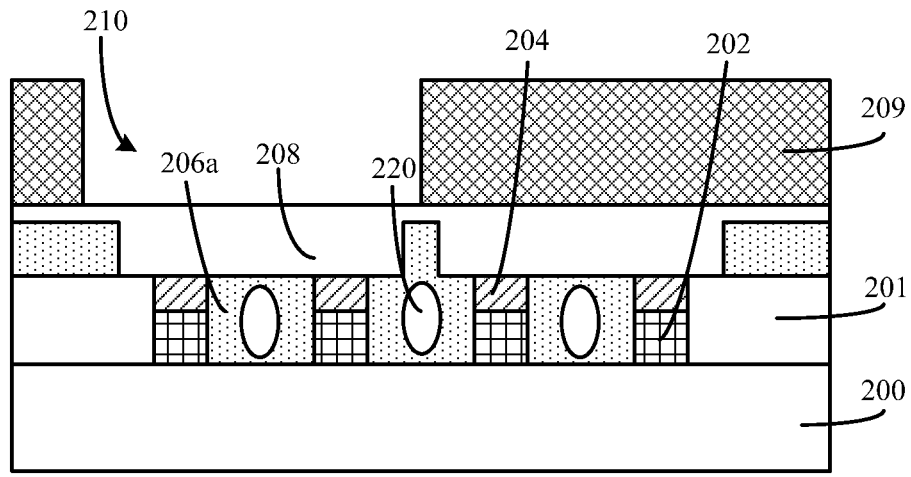
Figure 11:
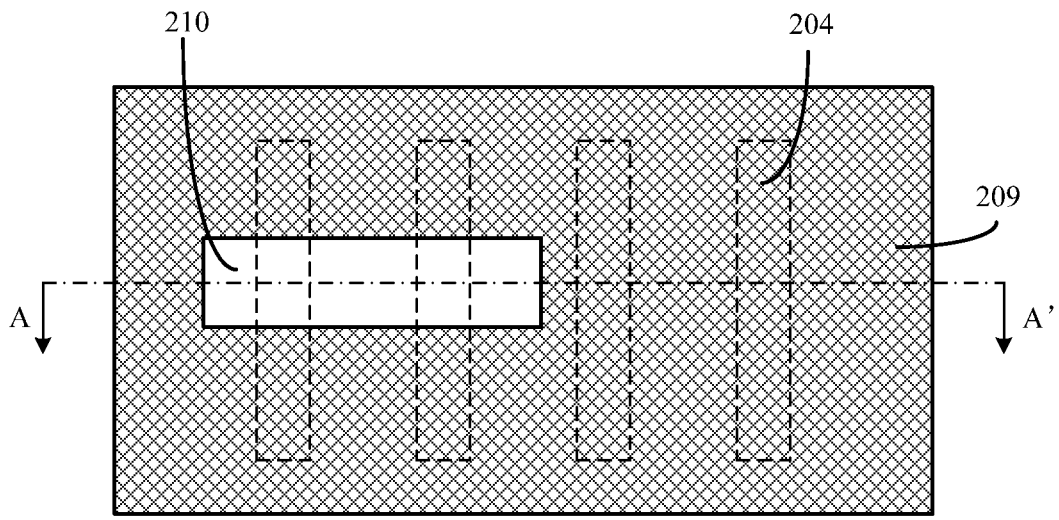

FIG. 11 is a top view of the semiconductor structure having the cross sectional view as shown in FIG. 10 in A-A' direction. As shown in FIGS. 10-11, a bottom antireflection layer 208 can be formed to completely fill the second opening 207 and formed on the surface of the third dielectric layer 206. The bottom antireflection layer 208 can have a flat surface. A patterned photoresist layer 209 can be formed on surface of the bottom antireflection layer 208. The photoresist layer 209 can contain grooves 210 that can expose the bottom antireflection layer 208. The grooves 210 can be configured to provide a pattern in a direction parallel to the surface of the substrate 200 and configured to cross the pattern provided by the first conductive layer 202 in the direction parallel to the surface of the substrate 200.

The grooves 210 in the patterned photoresist layer 209 can define a position of the second dielectric layer 204 to be etched at the bottom of the second opening 207. Additionally, since the second dielectric layer 204 has an etching selectivity over the first dielectric layer, the grooves 210 can also expose a portion of the region between neighboring second dielectric layers 204. As such, the grooves 210 can expose a large region (e.g., which does not need to be aligned with the second dielectric layer 204). Accordingly, accuracy requirement for the photolithography process can be reduced and the photolithography process can be conducted with simplicity.

The bottom antireflection layer 208 can be used to completely fill the second opening 207 to prevent reflection during the exposure/development process of forming the photoresist layer. The process for forming the bottom antireflection layer 208 can be a spin coating process, and the bottom antireflection layer 208 can be made of silicon nitride and/or opaque organic materials.

In an exemplary embodiment, as shown in FIG. 11, the second dielectric layer 204 (and/or the first conductive layers 202) can be configured as a strip in the direction parallel to the surface of the substrate 200. The grooves 210 in the photoresist layer 209 can also be configured as a stripe in the direction parallel to the surface of the substrate 200. Still shown in FIG. 11, the groove 210 in a form (or pattern) of a stripe can be configured having a length direction perpendicular to a length direction of the stripe of the second dielectric layer 204 (and/or the first conductive layers 202).

The second dielectric layer 204 at the bottom of the grooves 210 can be removed in a subsequent process to expose the first conductive layer 202. The first dielectric layer 201 at the bottom of the grooves 210 cannot be removed in a subsequent process due to the distinguished etching selectivity between the first dielectric layer 201 and the second dielectric layer 204. In an exemplary embodiment, the two second dielectric layers 204 can be exposed at the bottom of the second opening 207, and an electrical connection between the two corresponding first conductive layers 202 under the two second dielectric layers 204 is required. Thus, the groove 210 can cross the entire top of the second opening 207 and the pattern (e.g., a strip) of the groove 210 can pass through the pattern (e.g., a strip) of the first conductive layer 202.

In FIG. 12, an etching process is performed using the photoresist layer 209 as a mask (as shown in FIG. 11) to etch the bottom antireflection layer 208 (as shown in FIG. 11) and a portion of the second dielectric layer 204 that is at the bottom of the second opening 207. A third opening 211 can be formed after removal of the second dielectric layer 204 to expose a portion of the top surfaces of at least two first conductive layers 202 (e.g., Step 150 of FIG. 14). After formation of the third opening 211 by etching, the photoresist layer 209 and the bottom antireflection layer 208 can be removed.

Since the third opening 211 exposes a portion of the top surfaces of at least two neighboring first conductive layers 202, the second conductive layer subsequently formed in the third opening 211 can electrically connect to the first conductive layer 202. In one embodiment, a barrier layer can also be formed on the surface of the first conductive layer 202, and can be made of conductive materials. The third opening 211 can expose the barrier layer. The subsequently formed second conductive layer can be on the surface of the barrier layer.

The etching process for etching the bottom antireflection layer 208 and the second dielectric layer 204 can be an anisotropic dry etching process. The side wall of the formed third opening 211 can be perpendicular to the surface of the substrate 200. In addition, since the first dielectric layer 201 has an etching selectivity relative to the second dielectric layer 204, the first dielectric layer 201 at the bottom of the groove 210 (as shown in FIG. 11) can be remained after the second dielectric layer 204 is etched. As a result, the third opening 211 can only be formed on the surface of the first conductive layer 202, and the position of the subsequently formed second conductive layer relative to the first conductive layer 201 can be accurate. Additionally, since the third opening 211 is formed only on the top of the first conductive layer 202, the air gap 220 in the third dielectric layer 206a can be prevented from opening (e.g., from being connected to the third opening 211) when forming the third opening 211. This can ensure a desired electrical isolation of the third dielectric layer 206a between neighboring first conductive layers 202.

In another embodiment, a fourth dielectric layer 216 can be formed between neighboring first conductive layers 202, and can contain an air gap 207. Since the third opening 211 is formed only on the top of the first conductive layer 202, the air gap in the fourth dielectric layer 216 cannot open when forming the third opening 211. This ensures the electrical isolation performance of the fourth dielectric layer.

The process for removing the photoresist layer 209 and the bottom antireflection layer 208 can be a dry etching process or a wet etching process. In an exemplary embodiment, a wet etching process can be employed. The wet etching process can have a high etching rate and can cause little or no damage to the third dielectric layer 206a and the first conductive layer 202. The second opening 207 can be exposed again to subsequently form a second conductive layer after removal of the bottom antireflection layer 208 in the second opening 207.

In FIG. 13, a second conductive layer 212 can be formed in both the third opening 211 (as shown in FIG. 12) and the second opening 207 (as shown in FIG. 12). The second conductive layer 212 in the third opening 211 can connect electrically to the first conductive layer 202, and the second conductive layer 212 in the second opening 207 can be used to interconnect the first conductive layers 202 at the bottom of the second opening 207. In addition, the second conductive layer 212b can also be formed on the surface of the second dielectric layer 204 that is not removed, and the second dielectric layer 204 can electrically isolate the first conductive layer 202 from the second conductive layer 212b (e.g., Step 160 of FIG. 14).

In an exemplary embodiment, a seed layer (not illustrated) can also be formed on the sidewall and the bottom surface of the second opening 207 and the third opening 211. The second conductive layer 212 can form on the surface of the seed layer and can completely fill the second opening 207 and the third opening 211.

The seed layer can prevent material diffusion of the second conductive layer. The seed layer can be made of conductive materials, and can conduct electricity in an electroplating process to grow the second conductive layer 212. The conductive materials for forming the seed layer can include a combination of Ta and TaN; Ru; CuAl; CuSi; CuAlSi; CuMn; and/or Co. The process for forming the seed layer can be any deposition process (e.g., chemical vapor deposition process), thus the seed layer can also be formed on the surface of the third dielectric layer 206a.

Additionally, the second conductive layer 212 can be made of copper, and can be formed on the surface of the seed layer using an ECP process. Since the seed layer can also be formed on the surface of the third dielectric layer 206a, the second conductive layer can also be formed on the surface of the third dielectric layer 206a. A polishing process can be performed to remove the second conductive layer on the surface of the third dielectric layer 206a after the ECP process such that the surface of the second conductive layer 212 can be levelled with the third dielectric layer 206.

In an exemplary embodiment, neighboring first conductive layers 202 can be electrically connected through the second conductive layer 212, and the first conductive layer 202 and the second conductive layer 212 can form a copper interconnection structure. In addition, the second conductive layer 212 can also be made of other conductive materials, e.g., aluminum, and/or tungsten.

In an exemplary embodiment, the surface of the first conductive layer can be lower than the surface of the first dielectric layer, and the second dielectric layer can be formed on the surface of the first conductive layer. The third dielectric layer formed on the surface of both the first dielectric layer and the second dielectric layer can contain the second opening that exposes at least two neighboring second dielectric layers. The second opening defines the structure and position of the second conductive layer. The third opening can be formed by removing a portion of the second dielectric layer at the bottom of the second opening and exposing a surface portion of the first conductive layer. Thus, the third opening can only expose the first conductive layer and have a precise position relative to the first conductive layer. The subsequently formed second conductive layer can be in the second opening and the third opening, and can be electrically connected to the first conductive layer. Additionally, since the third opening can expose only the surface of the first conductive layer, the position of the second conductive layer relative to the first conductive layer can be prevented from deviating. Further, electrical connection between the second conductive layer and the first conductive layer can be stabilized, and electrical isolation between neighboring first conductive layers can be desired with good quality.

Accordingly, the present disclosure provides a semiconductor structure (referring to FIG. 13), including a substrate 200 having a first dielectric layer 201 containing a certain number of first conductive layers 202, a top surface of the first conductive layers 202 being lower than a top surface of the first dielectric layer 201. A second dielectric layer 204 is formed on the surfaces of the first conductive layer 202, the top surface of the second dielectric layer 204 being levelled with the top surface of the first dielectric layer 201. A third dielectric layer 206a/206 on the surfaces of both the first dielectric layer 201 and the substrate 200. The third dielectric layer 206 contains second openings (not illustrated) to expose at least two adjacent second dielectric layers 204. Third openings (not illustrated) are formed by removing some of the second dielectric layers 204 at the bottom of the second openings such that the third opening exposes a portion of the top surface of at least two adjacent first conductive layers 202. Second conductive layers are formed in both the third opening and the second opening.

In an exemplary embodiment, the third opening can be formed by removing some of the second dielectric layers that are at the bottom of the second opening. Thus, the third opening can only expose the first conductive layer, and the position of the third opening relative to the first conductive layer is precise. The second conductive layer can be in the second opening and the third opening to electrically connect to the first conductive layer. Since the third opening can only expose the surface of the first conductive layer, the position of the second conductive layer relative to the first conductive layer can be prevented from deviating. As such, electrical connection between the second conductive layer and first conductive layer can be stabilized, and electrical isolation between neighboring first conductive layers can be desired with good quality.

Other applications, advantages, alternations, modifications, or equivalents to the disclosed embodiments are obvious to those skilled in the art.

What is claimed is:

1. A method for fabricating a semiconductor structure, comprising:
providing a first dielectric layer on a substrate, wherein the first dielectric layer includes a plurality of first conductive layers formed through the first dielectric layer, the plurality of first conductive layers having a top surface being levelled with a top surface of the first dielectric layer;
removing a portion of each first conductive layer of the plurality of first conductive layers to form a first opening in the first dielectric layer and on each first conductive layer;
forming a second dielectric layer in the first opening and having a top surface levelled with the top surface of the first dielectric layer;
forming a third dielectric layer at least on the first dielectric layer, the third dielectric layer containing a plurality of second-openings, each second-opening exposing at least two adjacent second dielectric layers at a bottom of the second-opening;
removing at least two adjacent second dielectric layers exposed at the bottom of a first second-opening to form third openings that expose top surfaces of at least two adjacent first conductive layers corresponding to the first second-opening, wherein a second second-opening in the third dielectric layer exposes at least two adjacent second dielectric layers at a bottom of the second second-opening; and
forming second conductive layers in the third opening, the first second-opening, and the second second-opening.

2. The method of claim 1, further including:
after forming the second dielectric layers, removing portions of the first dielectric layer that are between adjacent first conductive layers to form fourth openings that expose surface portions of the substrate; and forming the third dielectric layer in the fourth openings between adjacent first conductive layers.

3. The method of claim 2, wherein the third dielectric layer formed in the fourth openings between adjacent first conductive layers contains an air gap.

4. The method of claim 2, wherein forming the third dielectric layer and the plurality of second-openings includes:
depositing a third dielectric layer material in the fourth openings, and on surfaces of the first dielectric layer and the second dielectric layers;
planarizing the third dielectric layer material after the depositing process to provide the polished third dielectric layer with a top surface higher than the top surfaces of the first dielectric layer and the second dielectric layers; and
etching the polished third dielectric layer after planarizing to form the plurality of second-openings each exposing the at least two second dielectric layers.

5. The method of claim 4, wherein depositing the third dielectric layer material includes a PECVD process.

6. The method of claim 1, further including:
after forming the second dielectric layers, removing portions of the first dielectric layer that are between adjacent first conductive layers to form fourth openings that expose surface portions of the substrate;
forming a fourth dielectric layer in the fourth openings between adjacent first conductive layers, the fourth dielectric layer having a top surface levelled with top surfaces of both the second dielectric layers and the first dielectric layer; and
forming the third dielectric layer over the fourth dielectric layer.

7. The method of claim 6, wherein each of the fourth openings contains an air gap.

8. The method of claim 6, wherein forming the fourth dielectric layer includes:
forming a fourth dielectric thin film in the fourth openings and on both the first dielectric layer and the second dielectric layers, wherein the fourth dielectric thin film completely fills the fourth openings; and
polishing the fourth dielectric thin film until exposing the second dielectric layers to form the fourth dielectric layer.

9. The method of claim 8, wherein forming the fourth dielectric thin film includes a plasma enhanced chemical vapor deposition process (PECVD) process.

10. The method of claim 9, wherein the fourth dielectric thin film is made of a material including $SiO_2$, SiN, SiON, SiCOH, a low-k material, or a combination thereof.

11. The method of claim 1, wherein portions of the first dielectric layer between neighboring first conductive layers contain an air gap.

12. The method of claim 1, wherein forming the third openings corresponding to the first second-opening to expose the top surfaces of at least two adjacent first conductive layers includes:

forming a bottom antireflection layer to completely fill the plurality of second-openings and on the third dielectric layer, wherein the bottom antireflection layer has a flat surface;

forming a patterned photoresist layer on the bottom antireflection layer, wherein the patterned photoresist layer contains a groove to expose the bottom antireflection layer, and the groove is in a form as a stripe in a direction parallel to a surface of the substrate and passes across a stripe pattern of the first conductive layers in the direction parallel to the surface of the substrate;

etching the bottom antireflection layer and the second dielectric layers corresponding to the first second-opening using the patterned photoresist as a mask;

forming the third openings on top of the first conductive layers corresponding to the first second-opening; and removing the patterned photoresist and the bottom antireflection layer after forming the third openings.

13. The method of claim 12, wherein, in the direction parallel to the surface of the substrate, the first conductive layers are configured to be stripes having a length direction perpendicular to a length direction of the stripe of the groove in the patterned photoresist layer.

14. The method of claim 1, further including:

forming a barrier layer on the first conductive layer at the bottom of the first opening prior to forming the second dielectric layer, and forming the second dielectric layer on the barrier layer.

15. The method of claim 14, wherein forming the barrier layer uses a selective deposition process, and the barrier layer is made of a material including CoWP, CuAl, CuMn, Co, or a combination thereof.

16. The method of claim 1, wherein forming the second dielectric layer includes:

forming a second dielectric thin film to completely fill the first opening and on the first dielectric layer; and polishing the second dielectric thin film to expose the first dielectric layer to form the second dielectric layer.

\* \* \* \* \*